(12) United States Patent
Lin et al.

(10) Patent No.: US 6,580,412 B2
(45) Date of Patent: Jun. 17, 2003

(54) SIGNAL DISPLAY APPARATUS AND ASSOCIATED METHOD

(75) Inventors: Yen-Shan Lin, Taipei Hsien (TW); Da-Cheng Sung, Taipei Hsien (TW); Ming-Yih Duh, Miao-Li Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 0 days.

(21) Appl. No.: 09/683,958

(22) Filed: Mar. 6, 2002

(65) Prior Publication Data

US 2002/0190967 A1 Dec. 19, 2002

(51) Int. Cl.[7] .................................................. G08B 5/00
(52) U.S. Cl. .................. 345/100; 340/815.44; 345/100; 345/99; 345/98
(58) Field of Search .................. 326/93, 96; 340/815.4, 340/815.44; 345/127, 132, 99, 98, 100

(56) References Cited

U.S. PATENT DOCUMENTS

| | | | | |
|---|---|---|---|---|
| 4,348,666 A | * | 9/1982 | Ogita | ........................... 345/39 |
| 6,157,361 A | * | 12/2000 | Kubota et al. | .............. 345/100 |
| 6,344,800 B1 | * | 2/2002 | Ross | ....................... 340/815.4 |

* cited by examiner

Primary Examiner—Michael Tokar
Assistant Examiner—Vibol Tan
(74) Attorney, Agent, or Firm—Winston Hsu

(57) ABSTRACT

A signal display apparatus has a plurality of shift registers and a selecting circuit. The shift registers receives a first clock and the selecting circuit receives a selecting signal from a data flow according to a second clock, and output enabling signals to the shift registers according to the selecting signal. The shift registers selectively store data in the data flow according to the first clock in response to the enabling signals. The signal display apparatus and the method for storing data are capable of reducing the transfer time for a serial data single series signal to overcome the prior art shortcomings.

19 Claims, 12 Drawing Sheets

SIGNAL DISPLAY APPARATUS AND ASSOCIATED METHOD

BACKGROUND OF INVENTION

1. Field of the Invention

The invention relates to a signal display apparatus and an associated method, and more particularly, to a signal display apparatus and a method for storing a sequential data flow into shift registers of the signal display apparatus non-consecutively.

2. Description of the Prior Art

In modern information society, data is typically digitized into binary files for facilitating the processing of a huge amount of information via a semiconductor circuit. Each bit of data in the binary file is arranged in sequence to constitute a data flow so as to form the most fundamental digital data. Since the constituent bits of the digital data is arranged in a time sequence, a digital circuit is merely required to process a few bits of the sequential digital data at the same time. Thus, the design of the digital circuit can be substantially simplified and the layout dimensions of the digital circuit can be considerably reduced.

Among various types of digital circuits, a data register circuit for storing sequential data in a series manner is a fundamental constituent block. Please refer to FIG. 1. FIG. 1 is a function block diagram illustrating a combination of a conventional data register circuit 12 and a conventional interface circuit 10. The conventional interface circuit 10 has two output ends for outputting a sequential data signal 16 and a corresponding first clock 14, respectively. The data register circuit 12 is used to cooperate with the first clock 14 for storing the data signal 16 outputted from the interface circuit 10. The data register circuit 12 comprises two shift registers 18A and 18B with the same function, and which are referred to as the first shift register 18A and the second shift register 18B. Both of the shift registers 18A and 18B comprise a plurality of register units 19 which electrically connect to each other in a series manner. As shown in FIG. 1, four register units 19 are installed in the respective shift registers 18A, 18B for illustration. Each of the register units 19 is used to store a bit of data. The register unit 19 located on the right most side of the first shift register 18A is electrically connected to the register unit 19 located on the left most side of the second shift register 18B. Additionally, the first and second shift registers 18A and 18B have respective clock ends 22 for receiving triggers of the first clock 14 outputted from the interface circuit 10 to control operations of the first and second shift registers 18A and 18B.

The data register circuit 12 further comprises a display circuit 20 for displaying the sequential data stored in the data register unit 12. Explicitly speaking, the display circuit 20 has a plurality of display units 24, each of the display units 24 electrically connected to the corresponding register unit 19 for displaying the data in the corresponding register unit 19. The typical example of the display unit 19 is a light emitting diode (LED). The LED can be bright or dark depending on the conduction condition of the LED so as to represent the data of "1" or "0" stored in the corresponding register unit 19, respectively. The display circuit 20 has a variety of applications such as a network switch.

Since a plurality of terminals on the network exchange information with each other via the network switch, a display interface is required to display operational statuses of each of the terminals. A network administrator can thus conveniently monitor the operational statuses of each of the terminals on the network. For example, the network switch can utilize the circuit configuration shown in FIG. 1 to be the display interface. Under this situation, the four register units 19 of the first shift register 18A can be used to store four different types of the operational statuses for a first terminal. The operational statuses of a terminal could be the on-line status, the status of data transferring, the status of data collision, and so forth. Likewise, the second shift register 18B can be used to store four different types of the operational statuses for a second terminal. Data that represents the operational statuses for the respective terminals are provided to the data register circuit 12 in a series manner from the interface circuit 10 with reference to the first clock 14. Therefore, the display circuit 20 that cooperates with the first and second shift registers 18A and 18B can be used to display the related operational statuses of the first and second terminals via the display units 24. When the display units 24 are LEDs, the way for displaying the operational statuses of the terminals is to emit or to dim the light of the LEDs.

Please refer to FIG. 2. FIG. 2 is a timing diagram illustrating the relationship between the conventional first clock 14 with the conventional sequential data signal 16, both being outputted from the interface circuit 10. The horizontal axis of FIG. 2 represents time. With reference to the eight register units 19 in the data register circuit 12, one set of data 26 in the sequential data signal 16 has eight bits 16A, 16B, 16C, 16D, 16E, 16F, 16G, 16H. Among the data 26, the bits 16A to 16D are high-order (most significant) bits 26B, and the bits 16E to 16H are low-order (least significant) bits 26A. Furthermore, corresponding to each of the bits in the data 26, the first clock 14 also has eight corresponding clock periods 14A, 14B, 14C, 14D, 14E, 14F, 14G, 14H. Each of the clock periods has a period of T and is used to trigger operations of the first and second shift register 18A and 18B.

Please refer to FIGS. 3A to 3D. FIGS. 3A to 3D are schematic diagrams illustrating the operations of the conventional data register circuit 12 with the trigger of the first clock 14 at different clock periods. For clarity of description, the situation of storing the data 26 of FIG. 2 into the data register circuit 12 is taken as an example. The first register unit in the first shift register 18A is designated as the register unit 19A, and the second register unit in the first shift register 18A is designated as the register unit 19B. According to this designation, the register unit positioned at the right most side of the second shift register 18B is designated as the register unit 19H. The eight bits 16A to 16H of the data 26 have respective content of 1, 0, 1, 0, 0, 1, 1, 0, corresponding to the clock periods 14A to 14H of the first clock 14, respectively.

As shown in FIG. 3A, when the clock period 14A of the first clock 14 triggers the data register circuit 12, both of the first and second shift register 18A and 18B shift each of the bits in the respective register units 19 one bit right. Thus, the register unit 19A in the first shift register 18A is filled in with the first bit 16A of the data 26, and the numeral 23 is used to represent the content of the bit 16A. As shown in FIGS. 3A to 3D, arrows 28 are used to represent the movements toward the right-hand side for each of the bits in the data register circuit 12, and a symbol X is used to represent data stored in each of the register units 19 before the data 26 is shifted into the data register circuit 12. As shown in FIGS. 2 and 3A, the bit 16A is the first transferred bit in the data signal 16.

As time goes by, each of the clock periods of the first clock 14 triggers the first and second shift registers 18A and 18B to shift the content in each of the register units 19 to the respective adjacent right register unit 19 so as to store the bits of the data 26 successively. As shown in FIG. 3B, at the clock period 14B, the two bits 16A and 16B of the data 26 have been stored in the data register circuit 12. The bit 16A, which was originally stored in the register unit 19A of the first shift register 18A, is shifted to the register unit 19B according to the trigger of the clock period 14B. Then, the bit 16B of the data 26 is stored in the register unit 19A.

As shown in FIG. 3C, at the clock period 14E, the first five bits of the data 26 have been sequentially stored in the data register circuit 12 in time order of 16A, 16B, 16C, 16D, and 16E. The content of the bits 16A to 16E, which is 1, 0, 1, 0, 0, respectively, has been arranged in the left five register units of the data register circuit 12 from the right to the left. Finally, as shown in FIG. 3D, at the clock period 14H, all of the eight bits of the data 26 have been stored in the data register circuit 12 completely. The first transferred bit 16A of the data 26 is stored in the register unit 19H positioned at the most right-hand side of the second shift register 18B, and the last transferred bit 16H of the data 26 is stored in the register unit 19A positioned at the most left-hand side of the first shift register 18A.

According to the prior art, each of the bits of the data 26 is transferred in a series manner. The advantage of the prior art is that the circuit structure is more simplified. As shown in FIG. 1, the interface circuit 10 can utilize only one output end, which is typically a pin in a circuit, to output each of the bits of the data 26 sequentially. The layout of the interface circuit 10 thus can be considerably concise.

Nevertheless, whenever the content of the data 26 is changed, each of the bits of the data 26 is required to be re-transferred sequentially into the data register circuit 12. For example, when the content of the high-order bits 26B in the data 26 is changed from 1010 to 0011, although the content of the other four low-order bits 26A stored in the first shift register 18A is kept the same, the entire contents of the data 26, i.e., 00110110, is required to be re-transferred to the data register circuit 12 using duration of the eight clock periods according to the prior art. Particularly, since the high-order bits 26B of the data 26 have to be stored in the second shift register 18B through the first shift register 18A, when the data in the high-order bits 26B is updated, all of the bits in the data 26 have to be re-transferred from the prior art interface circuit 10 so as to update the data 26 in the data register circuit 12.

As previously described, the data register circuit 12 could be used in a network switch to display communications statuses for each terminal connected to the network switch by using a plurality of the display units 24. When the prior art data register circuit 12 is utilized in the network switch, the above-mentioned disadvantages will be more obvious. Typically, there is a possibility that only one specific status for a terminal among a plurality of terminals connected to the network switch is required to update. However, according to the prior art, to change the bit representing the specific status of the terminal in the data register circuit 12, all of the statuses of the terminals connected to the network switch are required to update simultaneously, even though the statuses of other terminals have not changed.

Furthermore, the data register circuit 12 having the eight register units 19 and the eight corresponding display units 24 shown in FIG. 1 is only a simplified example. In modern information applications, a terminal normally has four to eight statuses to be monitored, that is, a terminal has to be equipped with four to eight display units and the corresponding amount of register units. Generally, the network switch has to monitor more than ten terminals simultaneously. For displaying all of the statuses of the terminals, the data register circuit 12 has to be equipped with hundreds of the display units 24 and the corresponding amount of the register units 19. When only one status of a terminal is changed, each of the bits in the data register circuit 12 has to be shifted sequentially. In other words, a duration of hundreds of the clock periods is needed, and the update procedure wastes a considerable amount of time.

In past, if one desires to reduce the duration of the hundreds of clock periods, then the frequency of the clock must be increased. However, when the frequency of the clock is increased, the data register circuit 12 has to be re-designed into a high-frequency circuit for adapting to the high-frequency clock. Furthermore, the design, production, and fabrication of the high-frequency circuit are more expensive and time-consuming than the general circuit. Moreover, the conventional sequential update architecture of the data register circuit frequently has the disadvantage of signal flickering on the display units when operating at a higher frequency. Under this situation, taking the register unit 19A in FIG. 3 as an example, when the data signal is updated, all of the bits in the data signal are required to shift into the data register circuit 12 through the register unit 19A. Hence, during the movements of all of the bits in the data signal, the content of the register unit 19A is continuously changed. Consequently, the display unit 24 for displaying the data in the register unit 19A is continuously flickering. Accordingly, the life of the display unit 24 is reduced and the user monitoring the statuses of the display unit 24 feels uncomfortable. Because of this, erroneous judgment of the status of the display unit 24 will occur unexpectedly.

SUMMARY OF INVENTION

It is therefore a primary objective of the claimed invention to provide a signal display apparatus and a method for storing data to solve the above-mentioned problem.

According to the claimed invention, a signal display apparatus comprises a plurality of shift registers and a selecting circuit. The shift registers are used to receive a first clock. The selecting circuit is used to receive a selecting signal of a data flow according to a second clock, and output enabling signals to the shift registers according to the selecting signal. The shift registers selectively store data in the data flow according to the first clock for responding to the enabling signal.

It is an advantage of the claimed invention that the signal display apparatus and the method for storing data are capable of substantially reducing the transferring time for each bit of a single series signal to overcome the prior art shortcomings.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
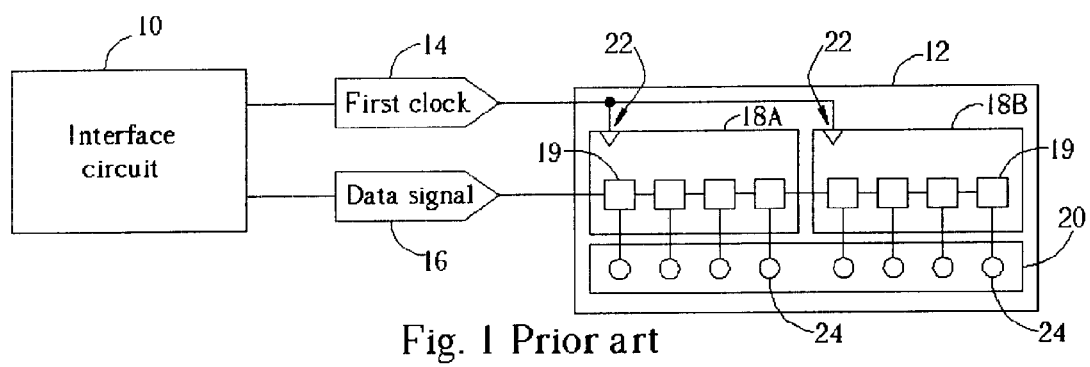
FIG. 1 is a function block diagram illustrating a combination of a data register circuit and an interface circuit according to the prior art.
Figure 2:
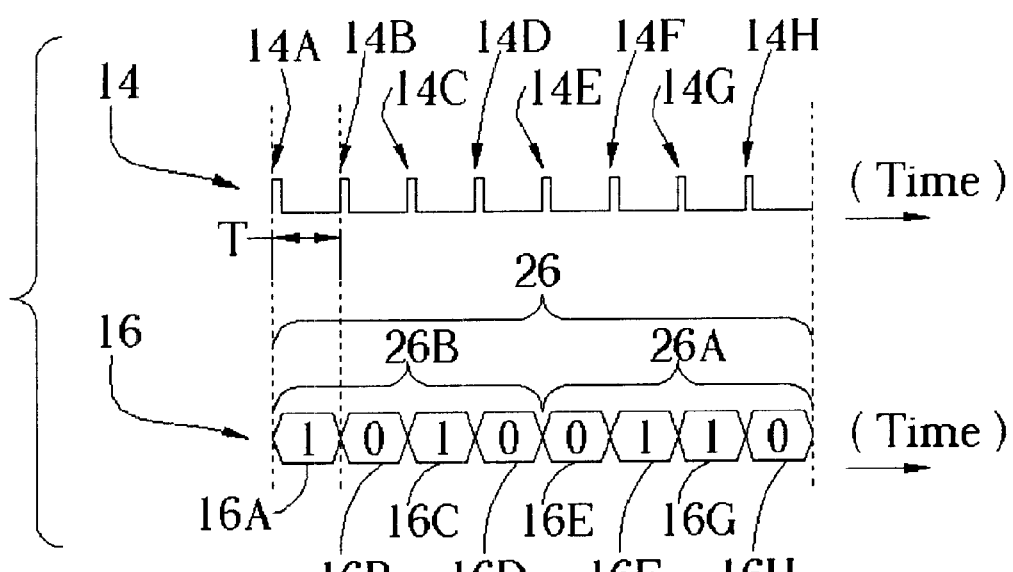
FIG. 2 is a timing diagram illustrating the relationship between a first clock with a sequential data signal in the data register circuit according to the prior art.
Figure 3A:
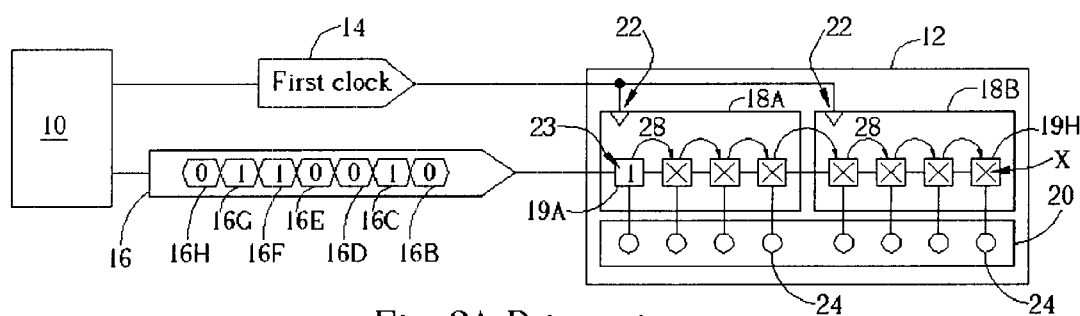
FIGS. 3A to 3D are schematic diagrams illustrating the statuses of the data register circuit when shifting each of bits sequentially in the data register circuit according to the prior art.
Figure 3B:
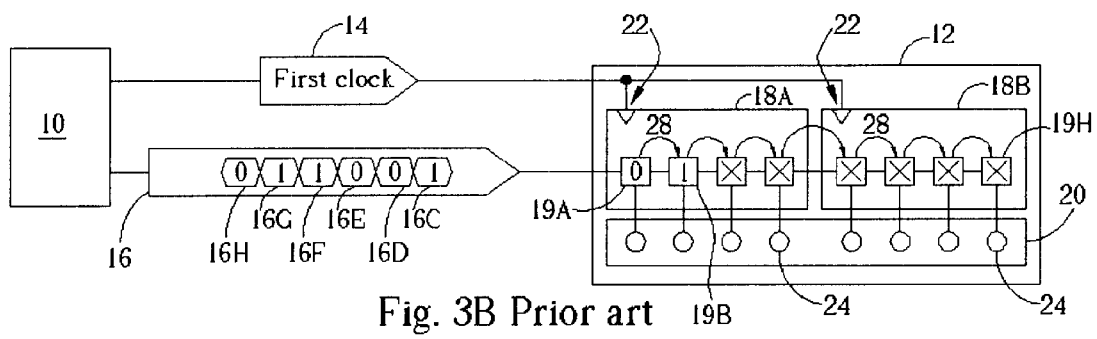
Figure 3C:
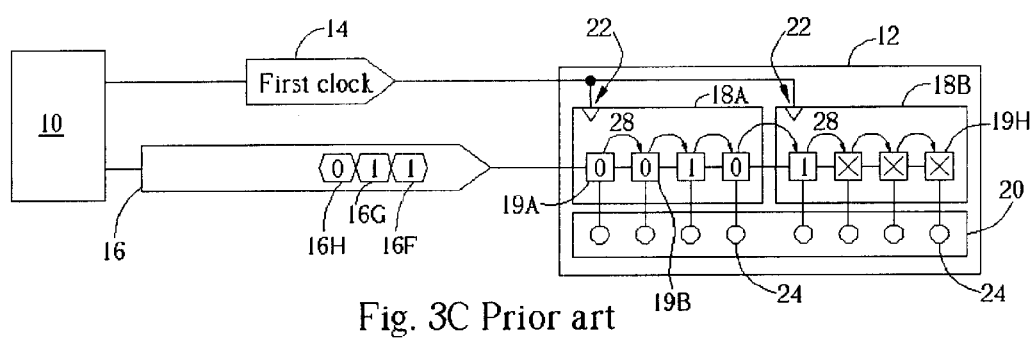
Figure 3D:
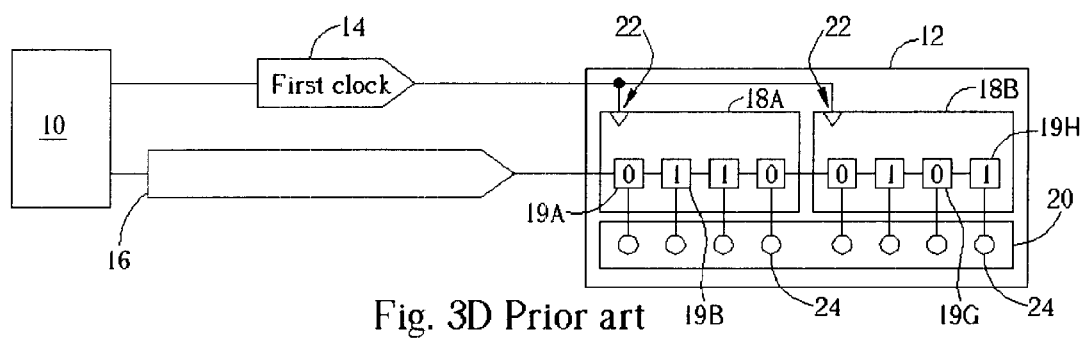
Figure 4:
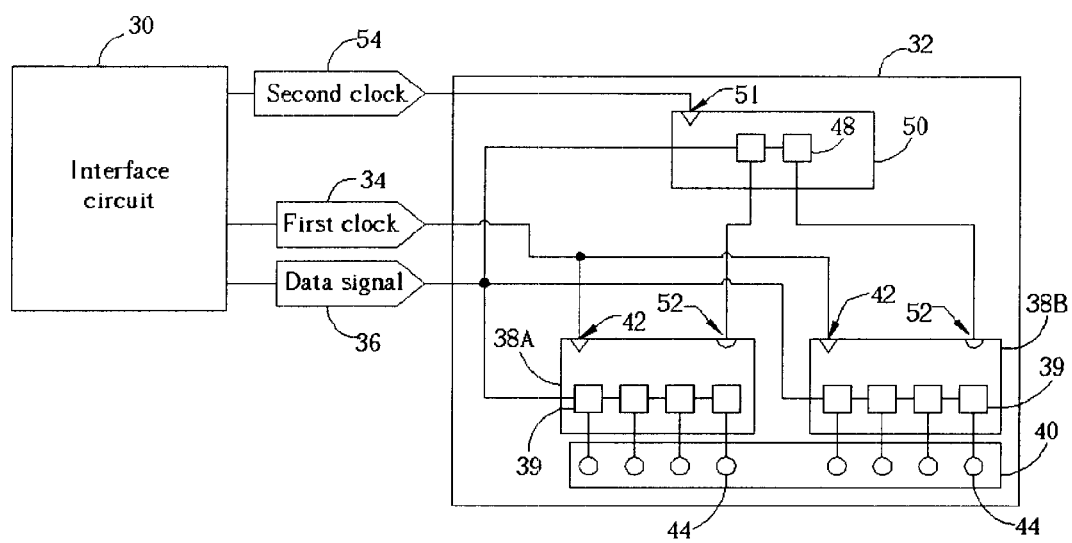
FIG. 4 is a function block diagram of a signal display apparatus according to the present invention.

Please refer to FIG. 4. FIG. 4 is a function block diagram illustrating a signal display apparatus according to an embodiment of the present invention. An interface circuit 30 is an external integrated circuit for providing a first clock 34, a second clock 54, and a sequential data signal 36 (also called a sequential data flow). The signal display apparatus 32 is used to control the signal display apparatus. The signal display apparatus 32 comprises a selecting circuit 50, the display circuit 40, and two shift registers 38A and 38B, which are called the first shift register 38A and the second shift register 38B. Surely, the signal display apparatus 32 according to the present invention can be equipped with more than two shift registers. The signal display apparatus 32 having only two shift registers 38A and 38B is only an embodiment of the present invention.

Both of the shift registers 38A and 38B comprise a plurality of register units 39. As shown in FIG. 4, four register units 39 are installed in the respective shift registers 38A, 38B for illustration. Each of the register units 39 is used to store a bit of digital data. Additionally, each of the first and second shift registers 38A and 38B has a clock end 42 and a control end 52. The shift registers 38A and 38B can be activated by triggers of the first clock 34 inputted from the clock end 42, and be enabled or disabled by signals inputted from the control end 52. The first and second shift registers 38A and 38B of the present invention are not connected to each other like the first and second shift registers 18A and 18B of the prior art data register circuit 12. The display circuit 40 has a plurality of display units 44. Each of the display units 44 corresponds to a register unit 39 for displaying the status of the stored bit in the corresponding register unit 39.

As shown in FIG. 4, preferably, the selecting circuit 50 could be realized by another shift register. In this embodiment of the present invention, the selecting circuit 50 comprises a plurality of register units 48. Each of the register units 48 can store one bit data. The number of register units 48 corresponds to the number of shift registers. Since two shift registers 38A and 38B are installed in the signal display apparatus 32 of FIG. 4, two corresponding register units 48 are required in the selecting circuit 50. Each of the register units 48 is electrically connected to the respective control ends 52 of the shift registers 38A and 38B. According to each bit stored in the register unit 48, the corresponding shift register 38A or 38B is enabled or disabled. Furthermore, the selecting circuit 50 also has a clock end 51 and operates in response to the triggers of the second clock 54. The first shift register 38A, the second shift register 38B, and the selecting circuit 50 can all receive the data signal 36 outputted from the interface circuit 30.

The signal display apparatus including the signal display apparatus 32 and the display circuit 40 has a variety of applications such as a network switch. Since a plurality of terminals may exchange information with each other via a switch device, a display interface is required to display operational statuses of each of the terminals. A network administrator can thus conveniently monitor the operational statuses of each of the terminals on the network. For example, the network switch can utilize the circuit configuration shown in FIG. 4 to be the display interface. Under this situation, the four register units 39 of the first shift register 38A can be used to store four different types of operational statuses for a first terminal. The operational statuses of a terminal could be, for example, the on-line status, the status of data transferring, the status of data collision, and so forth. Likewise, the second shift register 38B can be used to store four different types of operational statuses for a second terminal. Preferably, the display units 44 comprise LEDs to display the operational statuses of the terminals by emitting or dimming the light of the LEDs.

Figure 5:
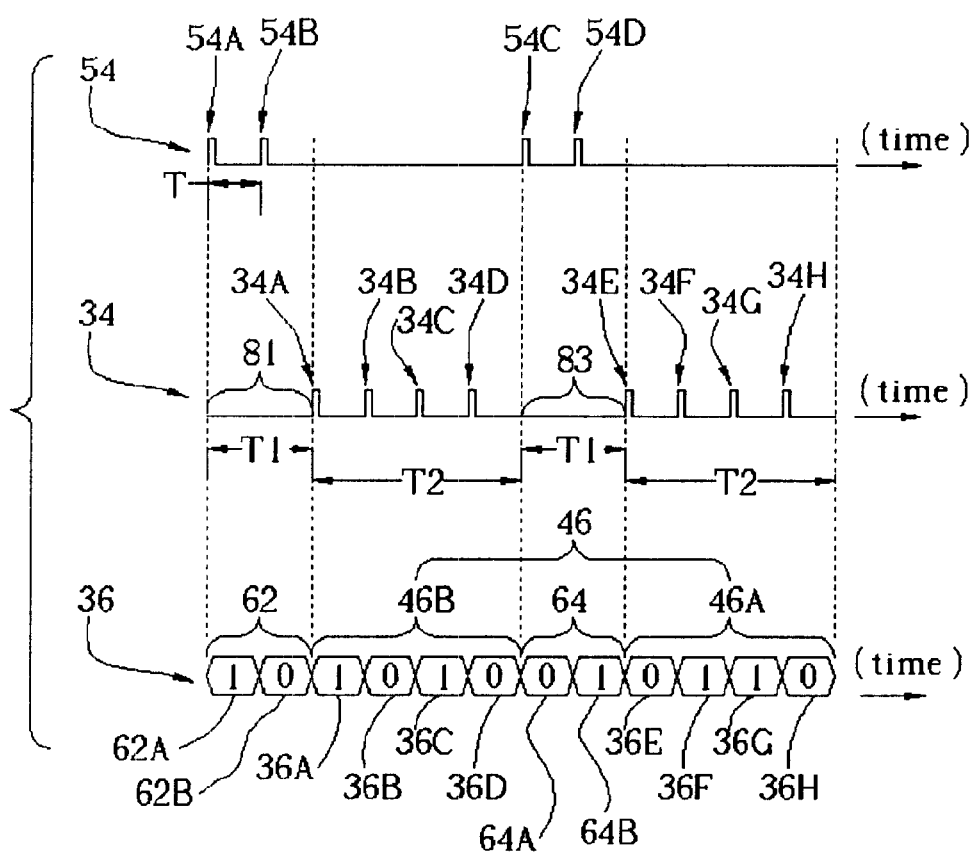
FIG. 5 is a timing diagram illustrating the relationship between a first clock, a second clock, and a data signal according to the present invention.

Please refer to FIG. 5. FIG. 5 is a timing diagram illustrating the relationship between the first clock 34, the second clock 54, and the data signal 36, all being outputted from the interface circuit 30 according to the present invention. The horizontal axis of FIG. 5 represents time. In addition to a set of data 46, the data signal 36 comprises a selecting signal, including two sets of selecting data 62 and 64. According to the embodiment shown in FIG. 4, the set of data 46 with eight bits can be divided into two segments of data, each having four bits. The two segments of data are the data with high-order (most significant) bits 46B and the data with low-order (least significant) bits 46A. Each segment of the data is stored in the respective four register units 39 of the two shift registers 38A and 38B. The selecting data 62 and 64 corresponding to the data 46B and 46A are used to separate the segment of the data 46A from the segment of the data 46B in the data 46.

Furthermore, the first clock 34 and the second clock 54 comprise a plurality of clock pulses. Each of the clock pulses has a period of T. Each of the bits in the data signal 36 corresponds to one clock pulse. During the duration corresponding to the selecting data 62 and 64, the first clock 34 has a corresponding duration of T1, preferably, in which there are no clock pulses, so as to be used as identification signals 81 and 83. On the other hand, during the duration corresponding to the data 46A and 46B, the second clock 54 has no clock pulses, and has a corresponding duration of T2. Conversely, the second clock 54 has clock pulses during the duration of T1. That is, the first clock 34 and the second clock 54 are complementary in view of time scale.

Figure 6A:
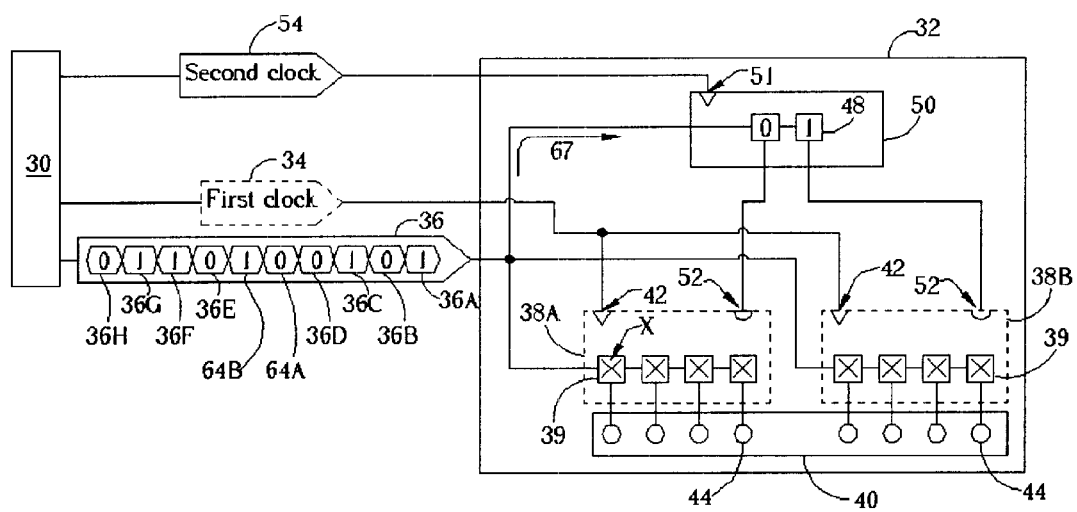
FIGS. 6A to 6D are schematic diagrams illustrating each stage for using the apparatus shown in FIG. 4.

Please refer to FIGS. 6A to 6D with reference to FIG. 5. FIGS. 6A to 6D are schematic diagrams illustrating various stages for storing the data 46 from the data signal 36 into the signal display apparatus 32 shown in FIG. 4. As shown in FIG. 6A, when the first two clock pulses 54A and 54B of the second clock 54 trigger the signal display apparatus 32, the first two bits 62A and 62B of the data signal 36 are sequentially stored in the two register units 48 of the selecting circuit 50. At the first two clock pulses 54A and 54B of the second clock 54, i.e., during the duration T1, the first clock 34 corresponds to the identification signal 81, in which there are no clock pulses. The first and second shift registers 38A and 38B are thus not triggered and the stored data in the first and second shift registers 38A and 38B is not changed. The dotted frames in FIG. 6A are used to represent that the shift registers 38A and 38B are not triggered since the first clock 34 has no clock pulses during the duration T1. Additionally, an arrow 67 is used to represent the flow of the data 36, and a symbol X is used to represent data stored in each of the register units 39 before the data 36 is stored into the signal display apparatus 32. Thus, the register units 48 in the selecting circuit 50 are filled in with the first two bits 62A and 62B of the selecting data 62.

Figure 6B:
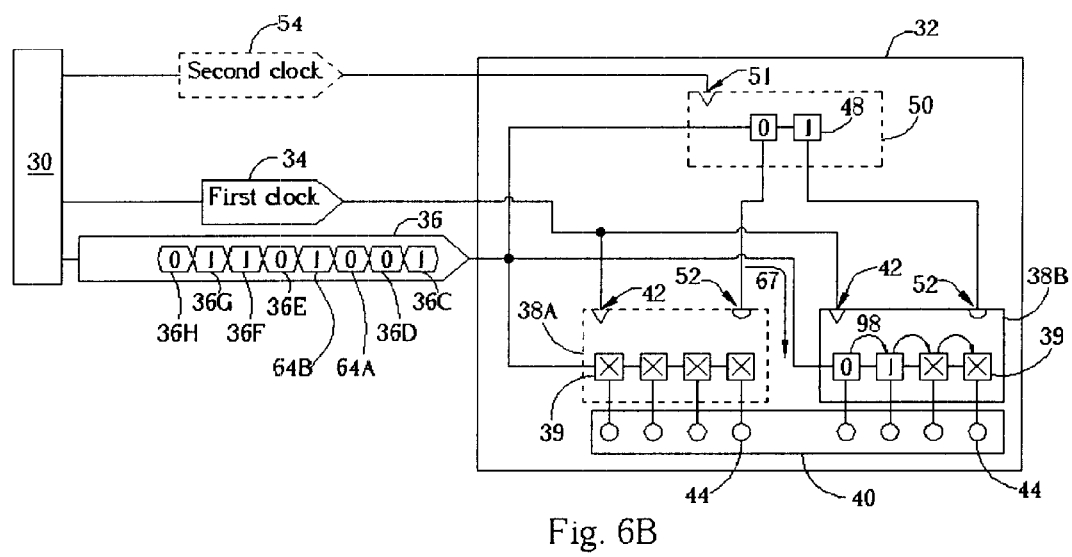

For a diagram of another stage, please refer to FIG. 6B. After the end of the first two clock pulses 54A and 54B of the second clock 54, since the second clock 54 (shown in a dotted frame) has no clock pulses during the duration T2, the register units 48 of the selecting circuit 50 (also shown in a dotted frame) are not triggered as well. However, the selecting data 62 stored in the selecting circuit 50 controls the first and second shift registers 38A and 38B. The first bit 62A of the selecting data 62 enables the second shift register 38B, and the second bit 62B of the selecting data 62 disables the first shift register 38A, which is represented by a dotted frame. Meanwhile, even if the clock pulses of the first clock 34 trigger the first shift register 38A, the statuses of each of the register units 39 in the first shift register 38A are not changed since the first shift register 38A is disabled in response to the selecting circuit 50. Conversely, the first clock 34 can trigger the enabled second shift register 38B so as to perform the storing process. As shown in FIG. 6B, with the triggers of the clock pulses 34A and 34B of the first clock, the first two bits 36A and 36B of the data with high-order portion 46B are shifted to the second shift register 38B. The arrow 67 is used to represent that the data signal 36 flows to the second shift register 38B, and arrows 98 are used to represent that each of the bits in the second shift register 38B is shifted toward the right side so as to update the content of each of the register units 39 sequentially.

Figure 6C:
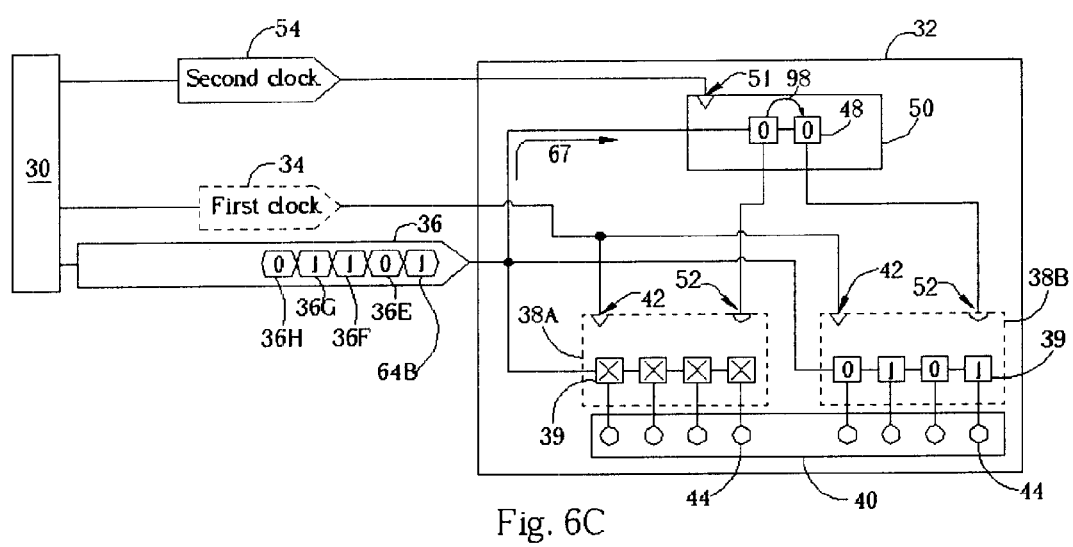

Please refer to FIG. 6C. After the first duration T2, the first clock 34 introduces another identification signal 83 with no clock pulses, i.e., another duration of T1. The first and second shift registers 38A and 38B (shown in dotted frames) are thus not triggered during the duration T1 since there are no clock pulses in the first clock 34 during the duration T1. Meanwhile, the data with the high-order portion 46B has been stored in the second shift registers 38B as shown in FIG. 6C. On the other hand, the clock pulses 54C and 54D of the second clock 54 starts to trigger the selecting circuit 50. The data signal 36 corresponding to the second duration T1 represents another selecting signal 64 including the selecting data. The bits 64A and 64B of the selecting signal 64 are sequentially stored in the two register units 48 of the selecting circuit 50 with the triggers of the second clock 54. As shown in FIG. 6C, with the triggering of the clock pulse 54C of the second clock 54, one bit 64A of the selecting data 64 is stored into the selecting circuit 50. Meanwhile, the register unit 48 positioned at the most right-hand side of the selecting circuit 50 buffers the bit 62B of the selecting data 62. Then, with the triggering of the clock pulse 54D, the bit 62B is replaced by the bit 64A, which is shifted from the register unit 48 at the most left-hand side of the selecting circuit 50, and the bit 64B is stored into the selecting circuit 50. Likewise, the arrow 67 is used to represent the flow of the data 36.

Figure 6D:
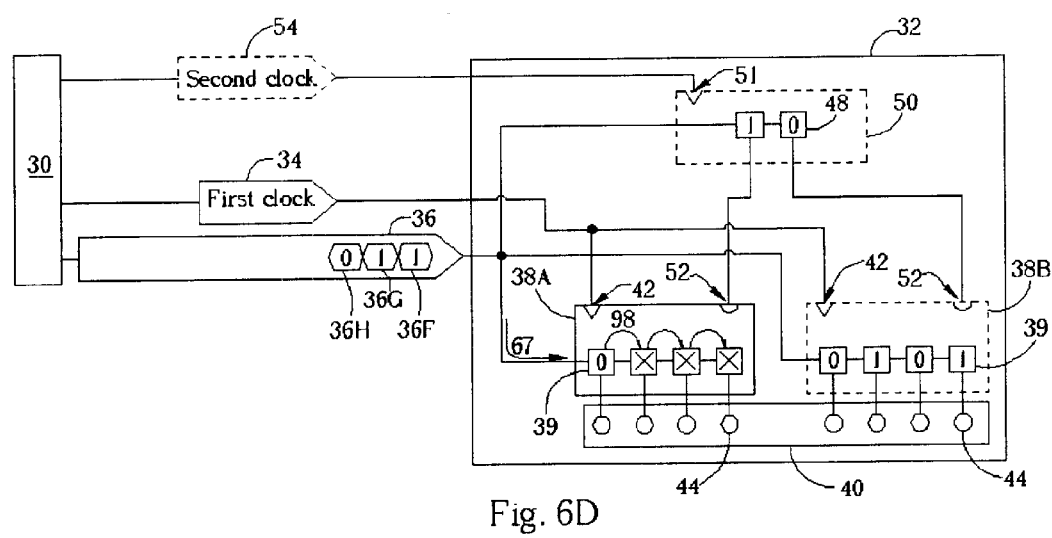

Please refer to FIG. 6D. After the second identification signal 83, the first clock 34 again introduces a plurality of clock pulses. Conversely, the second clock 54 stops triggering the selecting circuit 50 since there is no more clock pulses in the second clock 54. According to the stored selecting data 64 in the selecting circuit 50, the second shift register 38B is disabled and is not affected by the first clock 34, while the first shift register 38A is enabled. As shown in FIG. 6D, when the clock pulse 34E of the first clock 34 triggers the first shift register 38A, the bit 36E of the data with the low-order bits 46A is stored into the first shift register 38A. Also, as the arrow 67 shows, the data signal 36 is used to change the content of the first shift register 38A by storing the data with the low-order portion 46A into the first shift register 38A. With the triggers of each of the clock pulses of the first clock 34 during the duration T2, each of the bits of the data 46A is shifted into the first shift register 38A sequentially. Finally, all of the data 46 is stored in the signal display apparatus 32 completely.

According to the present invention, the data for storing into the signal display apparatus 32 is divided into several portions of data, such as the data 46B and 46A. The data is separated according to the number of the shift registers of the signal display apparatus 32, i.e., the first and second shift registers 38A and 38B, and the number of the register units in each shift register. The above-mentioned respective portions of data are called sub-data hereafter. Each of the sub-data cooperates with the corresponding selecting data, such as the selecting data 62 and 64 in FIG. 5, to designate the shift register corresponding to the respective sub-data. For example, the sub-data 46A in FIG. 5 corresponds to the first shift register 38A. The second clock first triggers the selecting circuit to fetch the selecting data corresponding to a specific sub-data. Meanwhile, all data registers including shift registers 38A and 38B are not triggered according to the identification signals of the first clock, such as the identification signal 81. After the selecting circuit stores the selecting data, the selecting circuit enables the shift register associated with the specific sub-data in response to the selecting data. For example, the data with high-order portion 46B in FIG. 6B associate with the second shift register 38B. Then, the first clock triggers the enabled shift register to store the specific sub-data into the corresponding shift register.

As shown in FIGS. 6A and 6B, the data with high-order portion 46B of the data signal 36 is stored directly into the corresponding second shift register 38B, and is not required to pass through the first shift register 38A. It should be noted that, in the prior art, when the data with high-order bits is stored sequentially into the second shift register, the data with high-order bits has to pass through the first shift register first. Thus, the disadvantage of the prior art is whenever a portion of the content of the data in the signal display apparatus is changed, each of the bits in the data is required to be re-transferred sequentially into the signal display apparatus. Assume that the prior art data register circuit has thirty-two shift registers, each having four respective register units. When the content of the four register units in one shift register is changed, the prior art interface circuit requires 128 clocks to complete the re-transfer of the 128 bits of the data into the prior art data register circuit.

In contrast to the prior art, under the same above-mentioned situations, the interface circuit of the present invention merely utilizes the selecting data for selecting the corresponding shift register in 32 clocks, and updates the sub-data with four clock pulses, to update the display information. Therefore, the efficiency in updating display information of the present invention has significantly increased. Furthermore, the selecting circuit of the present invention can comprise a decoder (not shown) for decoding the output from the selecting circuit so as to control each of the shift registers in the signal display apparatus. Thus, the bits of the selecting data can be further reduced. Under this circumstance, only five bits of the selecting data are required to control the thirty-two shift registers by the decoder. In other words, the present invention can further reduce the clock cycles for selection from 32 clocks to 5 clocks. Thus, only 9 clocks are required to update any specific 4 bits.

With the above-mentioned advantage, the signal display apparatus of the present invention is particularly suitable for the network switch for displaying status about terminals connected thereto. As previously described, there is a possibility that only one specific status for a terminal among said terminals is required to be updated. According to the prior art, to change the specific status of the terminal in the data register circuit, all of the statuses of the terminals connected to the network switch are required to be updated simultaneously, even though the statuses of other terminals are not changed. In contrast, according to the present invention, by utilizing the selecting signal to select the shift register corresponding to the specific status of the terminal, the updated status can be directly stored into the corresponding shift register instead of involving other shift registers corresponding to the other terminals.

Since each of the statuses corresponding to the shift registers is not required to be changed frequently, the signal updating efficiency is higher and the output quality of the display units is more stable than the prior art. Furthermore, the interface circuit 30 of the present invention still requires only one output end to provide the sequential data signal 36. Thus, the design and layout of the interface circuit 30 requires only a few pins to realize the purpose of high-speed displaying. Moreover, the present invention has an advantage of excellent flexibility. When there are more signals to be displayed, the time and cost for circuit design can be saved.

In contrast to the prior art, the signal display apparatus of the present invention utilizes two clock signals and a sequential data signal to store data. As previously described, the prior art uses single clock to trigger the data register circuit to process each of the bits of the data signal sequentially. In contrast, the two clocks of the present invention can cooperate with each other to store each of the sub-data of the sequential data non-consecutively. The data updating efficiency is thus greatly increased. Furthermore, the interface circuit of the present invention still requires only one output end to output the sequential data signal. Thus, the design and layout of the interface circuit is simple and the cost of the circuit design can be reduced.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A signal display apparatus comprising:
   a plurality of shift registers for receiving a first clock; and
   a selecting circuit for receiving a selecting signal from a data flow according to a second clock and outputting a plurality of enabling signals to the shift registers;
   wherein the shift registers selectively store data in the data flow according to the first clock in response to the enabling signals.

2. The signal display apparatus of claim 1 wherein the data flow is a sequential data flow.

3. The signal display apparatus of claim 1 wherein the signal display apparatus receives the first clock, the second clock, and the data flow via an external integrated circuit (IC).

4. The signal display apparatus of claim 1 wherein the first clock and the second clock are complementary in a time scale.

5. The signal display apparatus of claim 1 wherein a duration for triggering the selecting circuit by the second clock corresponds to a first duration of the selecting signal.

6. The signal display apparatus of claim 1 wherein the selecting circuit comprises a plurality of register units for storing the selecting signal.

7. The signal display apparatus of claim 6 wherein the register units are respectively coupled to the shift registers.

8. The signal display apparatus of claim 1 further comprising a display circuit for displaying data stored in the shift registers.

9. A method for providing a display signal comprising:
   providing a first clock;
   providing a second clock; and
   providing a data flow according to the first clock and the second clock;
   wherein the data flow comprises a selecting signal and a display data, the display data corresponds to the first clock, and the selecting signal corresponds to the second clock.

10. The method of claim 9 wherein the data flow is a sequential data flow.

11. The method of claim 10 further comprising displaying in parallel the display data defined by the sequential data flow.

12. The method of claim 9 wherein the first clock and the second clock are complementary in a time scale.

13. The method of claim 9 wherein a duration of triggering the selecting circuit by the second clock corresponds to a duration of the selecting signal.

14. The method of claim 9 wherein the selecting circuit comprises a plurality of register units for storing the selecting signal.

15. The method of claim 9 further comprising selectively receiving the display data in response to the selecting signal.

16. The method of claim 9 wherein the first clock comprises an identification signal for identifying the selecting signal and the display data.

17. The method of claim 9 further comprising triggering a plurality of shift registers by the first clock so as to store the display data by the shift registers according to the first clock.

18. The method of claim 9 further comprising triggering the selecting circuit by the second clock so as to receive the selecting signal and output a plurality of enabling signals by the selecting circuit.

19. The method of claim 18 wherein the shift registers selectively receive the display data in response to the enabling signals.

* * * * *